(12) United States Patent
Yu et al.

(10) Patent No.: US 10,157,852 B2
(45) Date of Patent: Dec. 18, 2018

(54) MULTI-STACKED PACKAGE-ON-PACKAGE STRUCTURES

(71) Applicant: Taiwan Semiconductor Manufacturing Company, Ltd., Hsinchu (TW)

(72) Inventors: Chen-Hua Yu, Hsinchu (TW); An-Jhih Su, Taoyuan (TW); Chi-Hsi Wu, Hsinchu (TW); Der-Chyang Yeh, Hsinchu (TW); Ming Shih Yeh, Zhubei (TW); Wei-Cheng Wu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/023,705

(22) Filed: Jun. 29, 2018

(65) Prior Publication Data

US 2018/0323150 A1 Nov. 8, 2018

Related U.S. Application Data

(63) Continuation of application No. 15/640,882, filed on Jul. 3, 2017.

(60) Provisional application No. 62/456,387, filed on Feb. 8, 2017.

(51) Int. Cl.

| | | |
|---|---|---|
| *H01L 21/00* | (2006.01) | |
| *H01L 23/538* | (2006.01) | |
| *H01L 21/56* | (2006.01) | |
| *H01L 25/065* | (2006.01) | |
| *H01L 23/00* | (2006.01) | |
| *H01L 21/683* | (2006.01) | |
| *H01L 25/00* | (2006.01) | |
| *H01L 21/3105* | (2006.01) | |

(Continued)

(52) U.S. Cl.
CPC .... *H01L 23/5389* (2013.01); *H01L 21/31053* (2013.01); *H01L 21/565* (2013.01); *H01L 21/568* (2013.01); *H01L 21/6835* (2013.01); *H01L 21/76802* (2013.01); *H01L 24/19* (2013.01); *H01L 24/24* (2013.01); *H01L 25/0655* (2013.01); *H01L 25/16* (2013.01); *H01L 25/50* (2013.01); *H01L 2221/68359* (2013.01); *H01L 2224/24137* (2013.01); *H01L 2924/19104* (2013.01)

(58) Field of Classification Search
None
See application file for complete search history.

(56) References Cited

U.S. PATENT DOCUMENTS

2014/0103488 A1 4/2014 Chen et al.
2015/0041987 A1* 2/2015 Yew .................. H01L 23/481
257/774

(Continued)

*Primary Examiner* — Angel Roman
(74) *Attorney, Agent, or Firm* — Slater Matsil, LLP

(57) ABSTRACT

A multi-stacked package-on-package structure includes a method. The method includes: adhering a first die and a plurality of second dies to a substrate, the first die having a different function from each of the plurality of second dies; attaching a passive device over the first die; encapsulating the first die, the plurality of second dies, and the passive device; and forming a first redistribution structure over the passive device, the first die, and the plurality of second dies, the passive device connecting the first die to the first redistribution structure.

20 Claims, 17 Drawing Sheets

(51) Int. Cl.
*H01L 21/768* (2006.01)
*H01L 25/16* (2006.01)

(56) References Cited

U.S. PATENT DOCUMENTS

| | | |
|---|---|---|
| 2015/0228580 A1* | 8/2015 | Chen ................ H01L 24/27 257/531 |
| 2015/0255427 A1 | 9/2015 | Sung et al. |
| 2017/0103968 A1 | 4/2017 | Prabhu et al. |
| 2017/0207197 A1 | 7/2017 | Yu et al. |
| 2017/0250171 A1 | 8/2017 | Yu et al. |
| 2017/0338202 A1 | 11/2017 | Tsai et al. |

* cited by examiner

MULTI-STACKED PACKAGE-ON-PACKAGE STRUCTURES

PRIORITY CLAIM AND CROSS-REFERENCE

This application is a continuation of U.S. patent application Ser. No. 15/640,882, filed on Jul. 3, 2017, which claims the benefit of U.S. Provisional Application No. 62/456,387, filed on Feb. 8, 2017, which applications are hereby incorporated herein by reference.

BACKGROUND

In a conventional Integrated Fan-Out (InFO) process, a top package, in which a first device die is bonded, is bonded to a bottom package. The bottom package may also have a device die packaged therein. By adopting the InFO process, the integration level of the packages is increased.

In an existing InFO process, the bottom package is formed first, which includes encapsulating a molding compound on a device die and a plurality of through-molding vias. Redistribution lines are formed to connect to the device die and the through-molding vias. A top package, which may include device dies bonded to an additional package substrate, is then bonded to the bottom package. A multi-stack package (sometimes referred to herein as a "MUST package") is a package with two or more levels of multiple semiconductor devices (sometimes referred to as "chips" or "dies"), and may be formed by repetition of the InFO process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
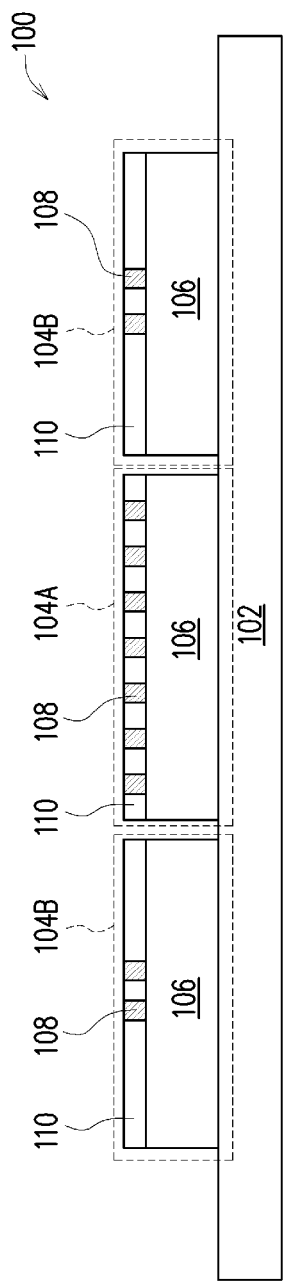
FIGS. 1 through 10 illustrate cross-sectional views of intermediate stages in the formation of a multi-stack die package, according to an embodiment.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A MUST package has multiple levels of semiconductor devices, each encapsulated in an encapsulating material. Some or all of the levels of device dies have no solder regions therebetween. Each layer of a multi-stack package includes one or more dies arranged side-by-side. A redistribution structure is formed on the dies of each layer. Multi-stack package-on-package structures are provided, in accordance with an embodiment. In particular, a multi-stack package includes a first layer with multiple dies. The dies in the first layer may be different types of dies, e.g., they may perform different functions. In an embodiment, the first layer includes a system-on-chip (SoC) device and several high-bandwidth memory (HBM) devices that are connected through the redistribution structure on the first layer. The multi-stack package further includes a second layer with one or more passive devices. The passive devices may include, e.g., integrated passive devices (IPDs), integrated voltage regulators (IVRs), or the like. Some variations of some embodiments are discussed. Throughout the various views and illustrative embodiments, like reference numbers are used to designate like elements.

FIGS. 1 through 10 illustrate cross-sectional views of intermediate stages in the formation of a multi-stack die package, according to an embodiment. A first package region 100 for the formation of a first package is illustrated. It should be appreciated that multiple packages could be simultaneously formed in multiple package regions.

In FIG. 1, integrated circuit dies 104 are attached to a carrier substrate 102. Three integrated circuit dies 104 are adhered to the carrier substrate 102. In other embodiments, more or less integrated circuit dies 104 may be adhered to the carrier substrate 102.

The carrier substrate 102 may be a glass carrier, a ceramic carrier, or the like. The carrier substrate 102 may be a wafer with a round top-view shape, such that multiple packages (e.g., in different package regions) can be formed on the carrier substrate 102 simultaneously. A release layer (not shown) may be formed on the carrier substrate 102. The release layer may be formed of a polymer-based material, which may be removed along with the carrier substrate 102 from the overlying structures that will be formed in subsequent steps. In some embodiments, the release layer is an epoxy-based thermal-release material, which loses its adhesive property when heated, such as a light-to-heat-conversion (LTHC) release coating. In other embodiments, the release layer may be an ultra-violet (UV) glue, which loses its adhesive property when exposed to UV lights. The release layer may be dispensed as a liquid and cured, may be a laminate film laminated onto the carrier substrate 102, or may be the like. The top surface of the release layer may be leveled and may have a high degree of coplanarity.

The integrated circuit dies 104 may each have a single function (e.g., a memory die), or may have multiple functions (e.g., a SoC). For example, the integrated circuit dies 104 may include a first die having a different function from each of a plurality of second dies. In an embodiment, the integrated circuit dies 104 include a SoC die 104A, and a plurality of HBM dies 104B. The integrated circuit dies 104 may be adhered to the carrier substrate 102 with an adhesive (not shown). The adhesive may be applied to a back-side of the integrated circuit dies 104, such as to a back-side of the respective semiconductor wafer, or may be applied over the surface of the carrier substrate 102. The integrated circuit dies 104 may be dies initially formed in a wafer that are singulated, such as by sawing or dicing, and adhered to the carrier substrate 102 by the adhesive using, for example, a pick-and-place tool. The adhesive may be any suitable adhesive, epoxy, die attach film (DAF), or the like.

The integrated circuit dies 104 include a substrate 106 having a front surface (e.g., the surface facing upwards in FIG. 1), sometimes called an active side, and a back surface (e.g., the surface facing downwards in FIG. 1), sometimes called an inactive side. The substrate 106 may be a semiconductor, such as silicon, doped or undoped, or an active layer of a semiconductor-on-insulator (SOI) substrate. The substrate 106 may include other semiconductor material, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices, such as transistors, diodes, capacitors, resistors, etc., may be formed in and/or on the substrate 106 and may be interconnected by an interconnect (not shown) formed by, for example, metallization patterns in one or more dielectric layers on the substrate 106 to form an integrated circuit. In accordance with some embodiments, through-vias do not extend though the substrate 106. In such embodiments, electrical connections for interconnecting the conductive features of the integrated circuit dies 104, e.g., the interconnect, may only be located on the front surface of the integrated circuit dies 104. Accordingly, through-vias do not need to be formed in the substrate 106, thereby reducing the manufacturing cost of the integrated circuit dies 104.

The integrated circuit dies 104 further include die connectors 108. The die connectors 108 may be conductive pillars (for example, comprising a metal such as copper, aluminum, tungsten, nickel, or alloys thereof), and are mechanically and electrically connected to the interconnect. The die connectors 108 may be formed by, for example, plating, or the like. The die connectors 108 electrically connect the respective integrated circuits of the integrated circuit dies 104.

The integrated circuit dies 104 further include a dielectric material 110 on the active side of the integrated circuit dies 104, such as on the interconnect (not shown). The dielectric material 110 laterally encapsulates the die connectors 108, and the dielectric material 110 is laterally coterminous with the integrated circuit dies 104. The dielectric material 110 may be a polymer such as polybenzoxazole (PBO), polyimide, BCB, or the like; a nitride such as silicon nitride or the like; an oxide such as silicon oxide, PhosphoSilicate Glass (PSG), BoroSilicate Glass (BSG), Boron-doped PhosphoSilicate Glass (BPSG), or the like; the like, or a combination thereof, and may be formed, for example, by spin coating, lamination, CVD, or the like.

Figure 2:
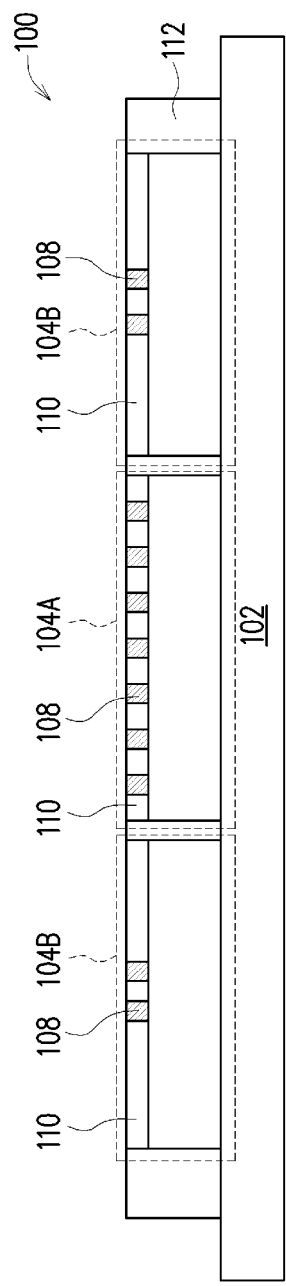

In FIG. 2, an encapsulant 112 is formed on the carrier substrate 102 and around the integrated circuit dies 104. The encapsulant 112 may be a molding compound, epoxy, or the like, and may be applied by compression molding, transfer molding, or the like. The encapsulant 112 may be formed to have a thickness of from about 50 µm to about 800 µm, such as about 200 µm. In some embodiments, the encapsulant 112 is formed to have a thickness of less than or equal to about 80 µm.

After curing, the encapsulant 112 may undergo a planarization process, such as a chemical-mechanical polish (CMP) or a grinding process, to expose the die connectors 108 of the integrated circuit dies 104. Top surfaces of the integrated circuit dies 104 (e.g., top surfaces of the die connectors 108 and the dielectric material 110) and the encapsulant 112 are coplanar after the planarization process. In some embodiments, the planarization may be omitted, for example, if the integrated circuit dies 104 are already exposed.

Figure 3:
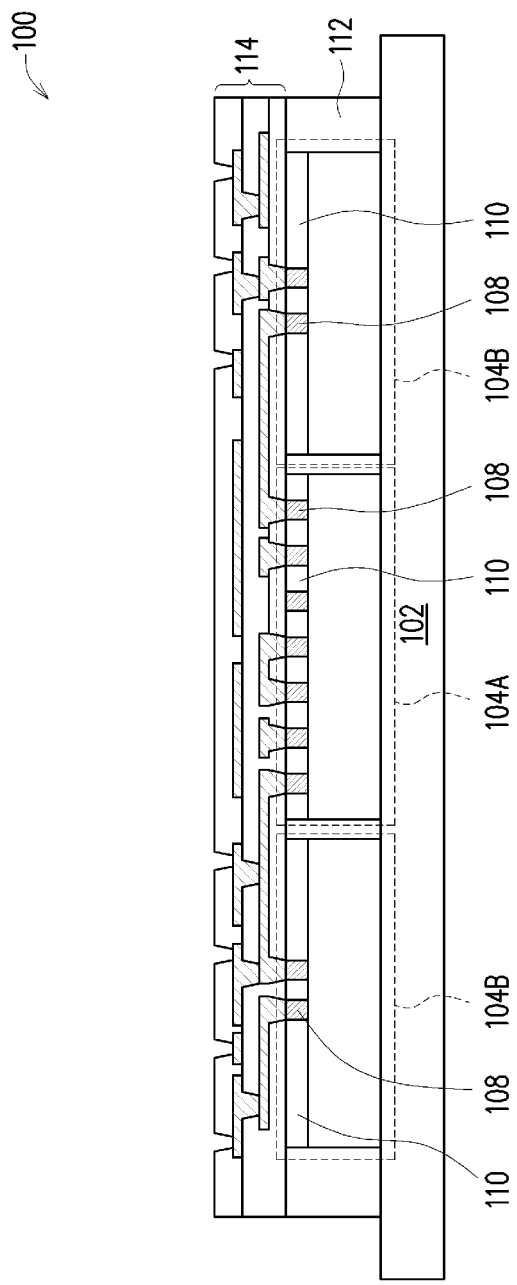

In FIG. 3, a first redistribution structure 114 is formed over the integrated circuit dies 104 and the encapsulant 112. The first redistribution structure 114 may be used to fan out electrical connections from the integrated circuit dies 104. It should be appreciated that the illustration of the first redistribution structure 114 throughout all figures is schematic. The first redistribution structure 114 may include redistribution lines (RDLs), such as metal traces (or metal lines), and vias underlying and connected to the metal traces. In accordance with some embodiments of the present disclosure, the RDLs are formed through plating processes, wherein each of the RDLs includes a seed layer (not shown) and a plated metallic material over the seed layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the RDLs. The patterning forms openings through the photo resist to expose the seed layer. A conductive material is formed in the openings of the photo resist and on the exposed portions of the seed layer. The conductive material may be formed by plating, such as electroplating or electroless plating, or the like. The seed layer and the plated metallic material may be formed of the same material or different materials. The conductive material may be a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet and/or dry etching. The remaining portions of the seed layer and conductive material form the RDLs.

Dielectric or passivation layers may be formed over each layer of the metal traces. In some embodiments, the dielectric or passivation layers are formed of a polymer, which may be a photo-sensitive material such as PBO, polyimide, BCB, or the like, that may be patterned using a lithography mask. In other embodiments, the dielectric or passivation layers are formed of a nitride such as silicon nitride; an oxide such as silicon oxide, PSG, BSG, BPSG; or the like. The dielectric or passivation layers may be formed by spin coating, lamination, CVD, the like, or a combination thereof.

Openings may be formed in the top dielectric or passivation layer with a patterning process, exposing some or all of the top metal layer of the first redistribution structure 114. The openings may not be formed in a center portion of the first package region 100. For example, the openings may be formed in a region of the top dielectric or passivation layers overlying the HBM dies 104B, but not in a region of the top dielectric or passivation layers overlying the SoC die 104A.

The patterning process may be an acceptable process, such as by exposing the dielectric or passivation layer to light when the dielectric layer is a photo-sensitive material or by etching using, for example, an anisotropic etch.

Figure 4:
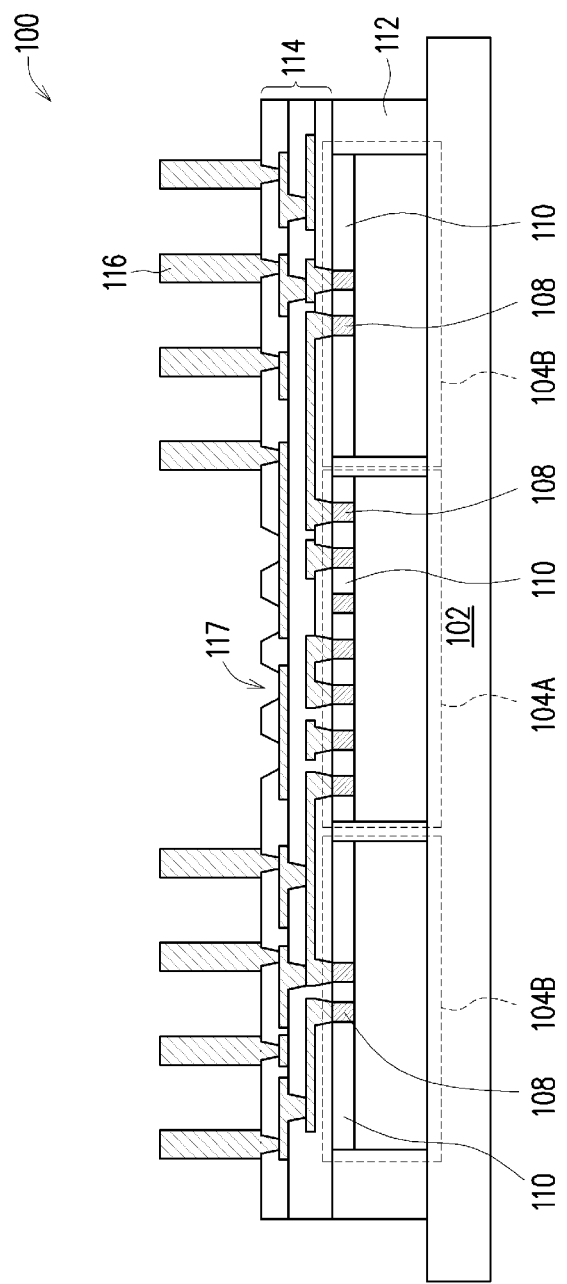

In FIG. 4, conductive vias 116 are formed contacting the top metal layer of the first redistribution structure 114 and extending away from the first redistribution structure 114. As an example to form the conductive vias 116, a seed layer (not shown) is formed over a top dielectric layer of the first redistribution structure 114. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to openings exposing the conductive pads of the top metal layer in the first redistribution structure 114. In particular, the photo resist may cover the region of the first redistribution structure 114 overlying the SoC die 104A. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the conductive vias 116. The conductive vias 116 may be formed to have a pitch of from about 60 µm to about 400 µm, such as about 120 µm.

Further in FIG. 4, openings 117 are formed in the top dielectric or passivation layer of the first redistribution structure 114. The openings 117 may be formed in a center portion of the first package region 100, and expose the pads or vias in the top surface of the first redistribution structure 114. In some embodiments, forming the openings 117 includes performing a laser drill on the top dielectric or passivation layer of the first redistribution structure 114. In some embodiments, the openings 117 may be patterned using a lithography mask.

Figure 5:
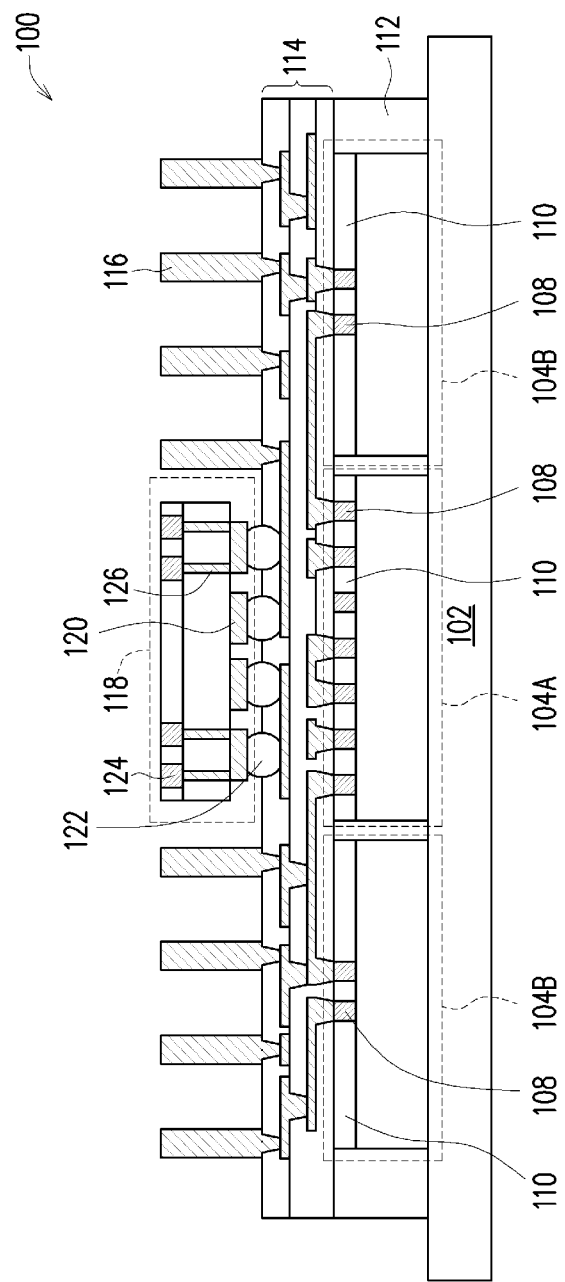

In FIG. 5, a passive device 118 is attached to the first redistribution structure 114 over the SoC die 104A. The passive device 118 is surrounded by the conductive vias 116 after being placed on the first redistribution structure 114. The passive device 118 may be electrically connected to one or more of the integrated circuit dies 104 through the first redistribution structure 114. In some embodiments, the passive device 118 is connected to only one of the integrated circuit dies 104, such as the SoC die 104A. In some embodiments, the passive device 118 is connected to more than one of the integrated circuit dies 104, such as the SoC die 104A and the HBM dies 104B. The passive device 118 may be placed onto the first redistribution structure 114 using, e.g., a pick-and-place tool, however, any other method of placing the passive device 118 may also be utilized.

Before being bonded to the first redistribution structure 114, the passive device 118 may be formed or processed according to applicable manufacturing processes. For example, the passive device 118 may be an IPD component that includes one or more passive devices in a main structure. The main structure could include a substrate and/or encapsulant. In the embodiments including a substrate, the substrate could be a semiconductor substrate, such as silicon, doped or undoped, or an active layer of a SOI substrate. The semiconductor substrate may include other semiconductor material, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The passive devices may include a capacitor, resistor, inductor, the like, or a combination thereof. In some embodiments, the passive device 118 is an entirely passive device (e.g., the substrate is free of active or doped regions such that it includes no active devices), such as an IVR. In some embodiments, the passive device 118 may be partially passive, e.g., may include some active devices. The passive devices may be formed in and/or on the semiconductor substrate and/or within the encapsulant, and may be interconnected by interconnect structures formed by, for example, metallization patterns in one or more dielectric layers on the main structure to form the passive device 118. Although shown as a single passive device 118, it should be appreciated that some embodiments may include multiple passive devices 118. In an embodiment, the passive device(s) 118 are one or more IVRs.

The passive device 118 further includes bumps 120 mechanically and electrically connected to the features of the passive device 118. The bumps 120 may be, e.g., micro bumps, and may be formed by, for example, plating, or the like. Conductive connectors 122 are formed on ends of the bumps 120 of the passive device 118. The conductive connectors 122 may be, e.g., solder balls, and form solder joints between the bumps 120 and pads or vias in the top surface of the first redistribution structure 114, thereby coupling the first redistribution structure 114 to the passive device 118. Attaching the passive device 118 to the first redistribution structure 114 includes forming the conductive connectors 122 in the openings 117, contacting the pads or vias. Forming the conductive connectors 122 may include forming solder balls in the openings 117, and reflowing the solder balls in the openings 117 to form connections with the bumps 120.

The passive device 118 may further include connectors 124 formed on an opposite side of the passive device 118 as the bumps 120. The connectors 124 may be conductive pillars (for example, comprising a metal such as copper, aluminum, tungsten, nickel, or alloys thereof), and are mechanically and electrically connected to the features of the passive device 118. The connectors 124 may be formed by, for example, plating, or the like. A dielectric material laterally encapsulates the connectors 124. The connectors 124 are optional. In some embodiments, such as embodiments where the passive devices 118 are IVRs, the IVRs do not include connectors 124, and are only connected to the first redistribution structure 114 with the bumps 120.

The passive device 118 may further include through silicon vias (TSVs) 126. The TSVs 126 extend through the substrate of the passive device 118, and connect the connectors 124 to the bumps 120. It should be appreciated that each one of the bumps 120 may not be connected to a respective connector 124. For example, some of the bumps 120 (e.g., a first subset) may be connected to the features of the passive device 118, and others of the bumps 120 (e.g., a second subset) may be connected to respective connectors 124 through the TSVs 126. Further, some of the bumps 120 may be connected to both the features of the passive device 118 and a respective connector 124.

The TSVs 126 may be formed by applying and developing a suitable photoresist to the silicon substrate of the passive device 118, and then etching the silicon substrate to generate TSV openings. The TSV openings may be filled with, e.g., a liner (not shown), a barrier layer (also not shown), and a conductive material. In an embodiment the liner may be a dielectric material such as silicon nitride, silicon oxide, a dielectric polymer, combinations of these, or the like, formed by a process such as chemical vapor deposition, oxidation, physical vapor deposition, atomic layer deposition, or the like. The barrier layer may comprise a conductive material such as titanium nitride, although other materials, such as tantalum nitride, titanium, another dielectric, or the like may alternatively be utilized. The barrier layer may be formed using a CVD process, such as PECVD. However, other alternative processes, such as sputtering or metal organic chemical vapor deposition (MOCVD), atomic layer deposition (ALD), may alternatively be used. The barrier layer may be formed so as to contour to the underlying shape of the TSV openings. The conductive material may comprise copper, although other suitable materials such as aluminum, tungsten, alloys, doped polysilicon, combinations thereof, and the like, may alternatively be utilized. The conductive material may be formed by depositing a seed layer and then electroplating copper onto the seed layer, filling and overfilling the TSV openings. Once the TSV openings have been filled, excess barrier layer and excess conductive material outside of the TSV openings may be removed through a planarization process such as a CMP or a grinding process, although any suitable removal process may be used.

Figure 6:
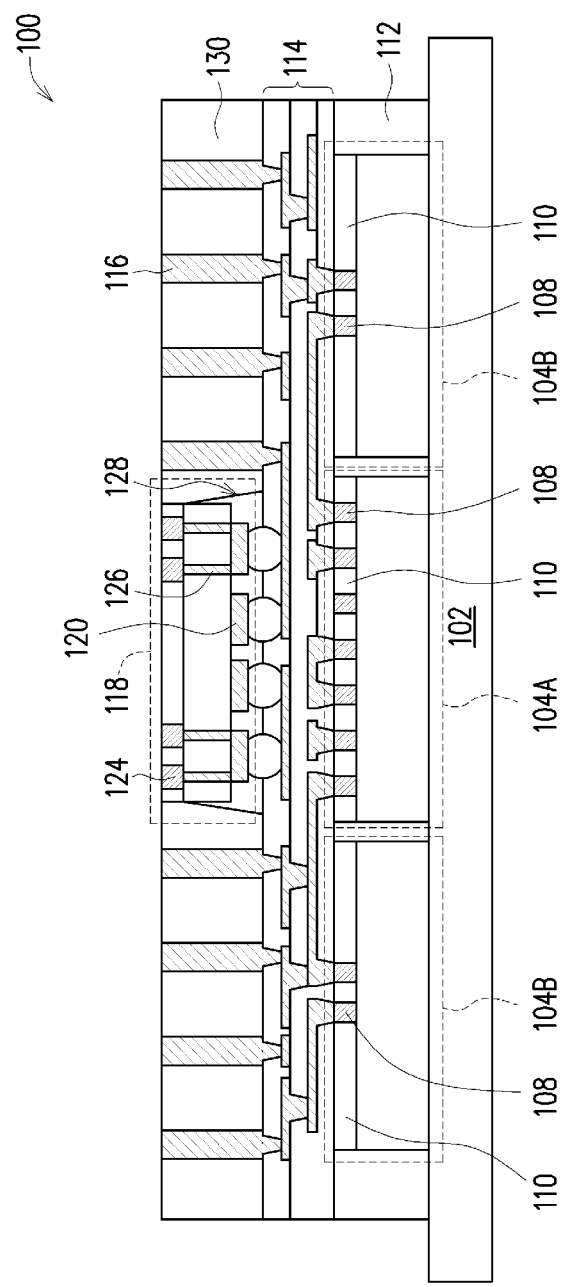

In FIG. 6, an underfill 128 is filled into the gap between the passive device 118 and the first redistribution structure 114 and around the bumps 120 and the conductive connectors 122. The underfill 128 may be a molding compound, an epoxy, an underfill, a molding underfill (MUF), a resin, or the like. The underfill 128 provides structural support for the passive device 118, and may be dispensed using capillary forces after the passive device 118 is bonded to the first redistribution structure 114. Other encapsulating processes may be used, such as lamination, compression molding, transfer molding, or the like. A curing step may then be performed to cure and solidify the underfill 128.

Further in FIG. 6, an encapsulant 130 is formed on the first redistribution structure 114, around the conductive vias 116 and the passive device 118. The encapsulant 130 may be similar to the encapsulant 112, and may be formed using similar or different techniques. After curing, the encapsulant 130 may undergo a planarization process to expose the conductive vias 116 and the top surface of the passive device 118 (e.g., the connectors 124). The planarization process may be a CMP, a grinding process, or the like. After planarization, the conductive vias 116 extend through the encapsulant 130, and top surfaces of the connectors 124, the conductive vias 116, and the encapsulant 130 are level. After formation of the encapsulant 130, the conductive vias 116 may be referred to as through mold vias. Because the through mold vias are formed in an encapsulant, they do not need to be formed through substrates such as the passive device 118, thereby reducing the costs associated with forming the through mold vias.

The underfill 128 is optional. In some embodiments, the underfill 128 may be omitted. In such embodiments, the encapsulant 130 may be filled into the gap between the passive device 118 and the first redistribution structure 114 during formation. As such, when the underfill 128 is omitted, the encapsulant 130 may instead be used to provide structural support for the passive device 118.

Figure 7:
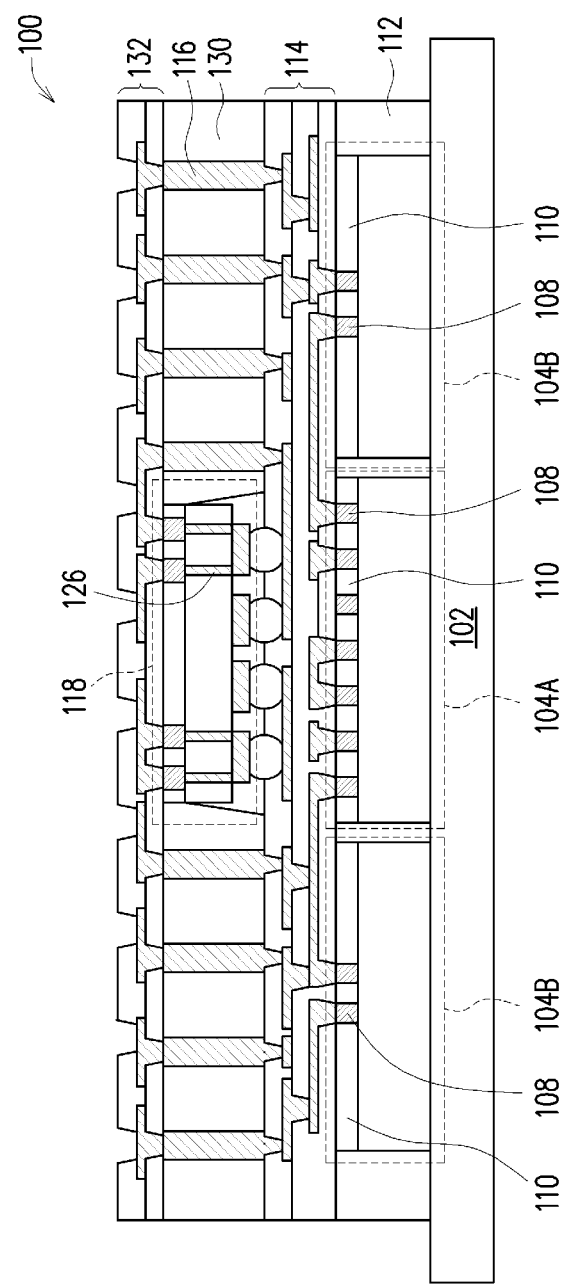

In FIG. 7, a second redistribution structure 132 is formed over the passive device 118, the encapsulant 130, and the conductive vias 116. The second redistribution structure 132 may be formed in a similar manner to the first redistribution structure 114. The second redistribution structure 132 may be used to fan out electrical connections from the integrated circuit dies 104 and/or the passive device 118, and is connected to those devices through the conductive vias 116, the TSVs 126, and/or the first redistribution structure 114. Openings may be formed in the top dielectric or passivation layer of the second redistribution structure 132, exposing some or all of the top metal layer of the second redistribution structure 132.

Figure 8:
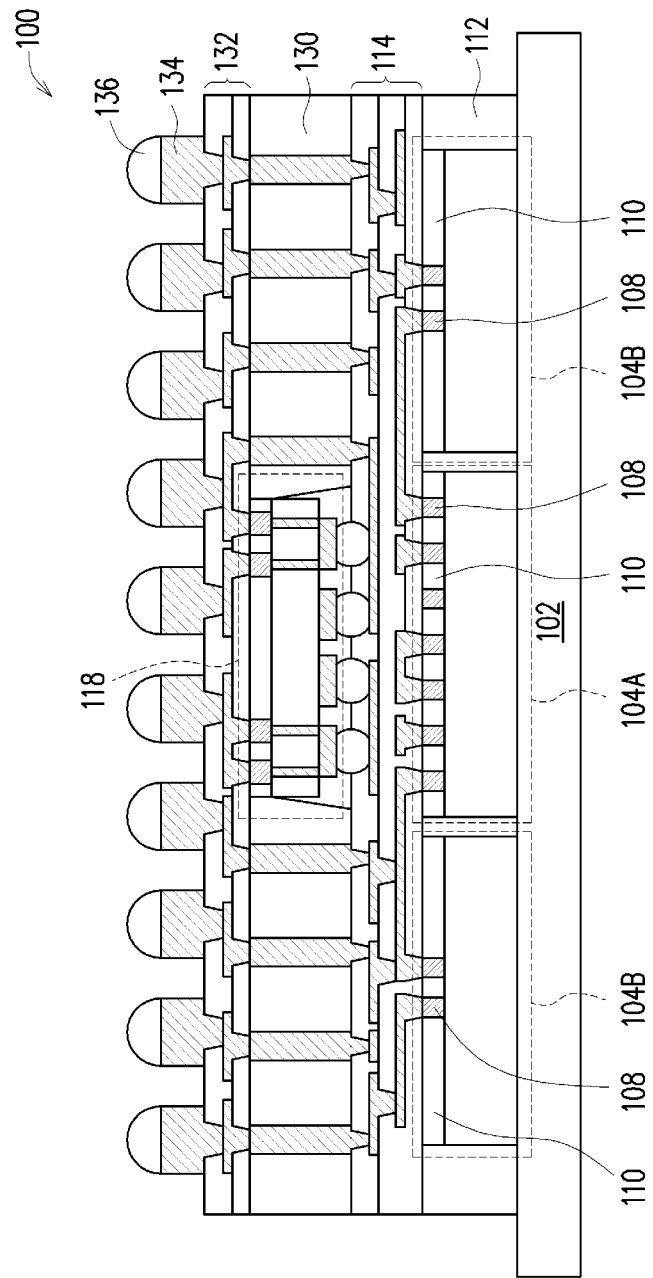

In FIG. 8, bumps 134 are formed through the openings in the dielectric layers of the second redistribution structure 132 to contact metallization patterns in the second redistribution structure 132. The bumps 134 may be metal pillars, controlled collapse chip connection (C4) bumps, micro bumps, electroless nickel-electroless palladium-immersion gold technique (ENEPIG) formed bumps, ball grid array (BGA) bumps, or the like. In an embodiment, the bumps 134 are C4 bumps. The bumps 134 may be formed by a sputtering, printing, electro plating, electroless plating, CVD, or the like. The bumps 134 may be solder free and have substantially vertical sidewalls. In some embodiments, a metal cap layer (not shown) is formed on the top of the bumps 134. The metal cap layer may include nickel, tin, tin-lead, gold, silver, palladium, indium, nickel-palladium-gold, nickel-gold, the like, or a combination thereof and may be formed by a plating process.

Further in FIG. 8, conductive connectors 136 are formed on the bumps 134. The conductive connectors 136 may be formed from a conductive material such as solder, copper, aluminum, gold, nickel, silver, palladium, tin, the like, or a combination thereof. In some embodiments, the conductive connectors 136 are formed by initially forming a layer of solder through methods such as evaporation, electroplating, printing, solder transfer, ball placement, or the like. Once a layer of solder has been formed on the structure, a reflow may be performed in order to shape the conductive connectors 136 into desired bump shapes.

Figure 9:
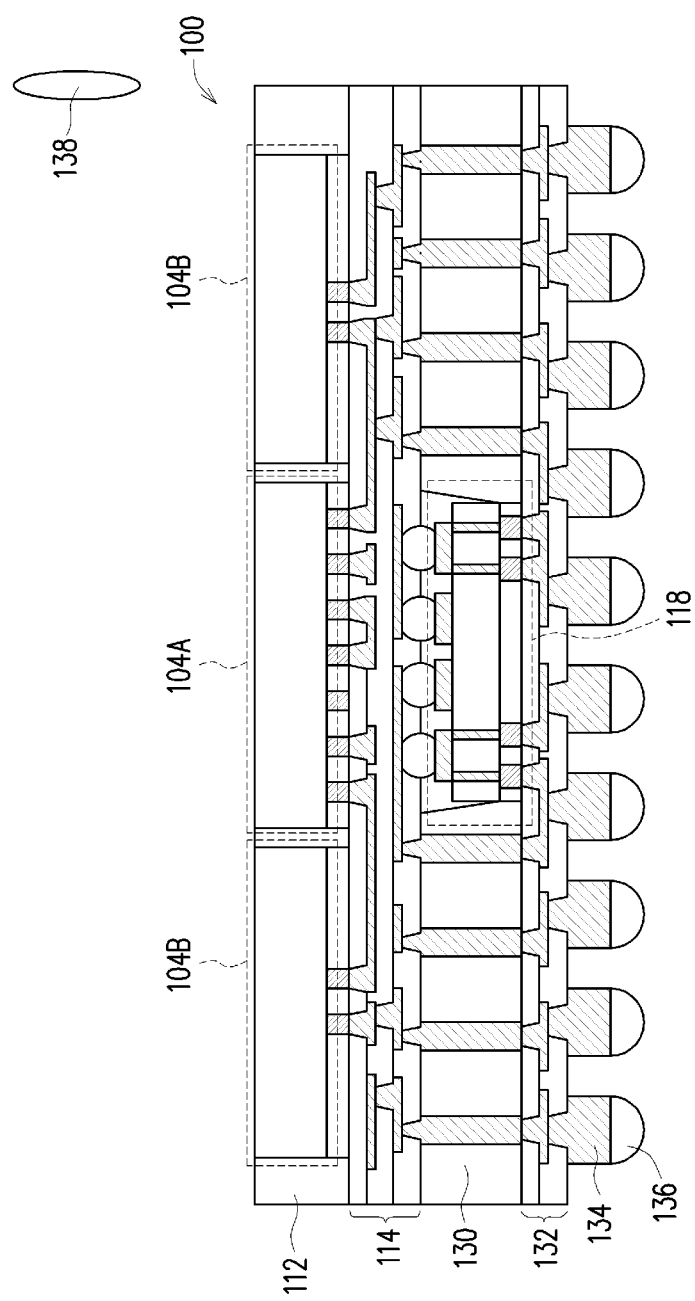

In FIG. 9, a carrier substrate de-bonding is performed to detach (de-bond) the carrier substrate 102 from the back side of the multi-stack die package. De-bonding may be accomplished through, e.g., use of the release layer (not shown). In accordance with some embodiments, use of the release layer includes projecting a light such as a laser light or an UV light on the release layer so that the release layer decomposes under the heat of the light and the carrier substrate 102 can be removed. A singulation process is performed by sawing 138 along scribe line regions e.g., between the first package region 100 and adjacent regions. The resulting intermediate singulated multi-stack die package is from the first package region 100. The singulated packages may also be referred to as a multi-stack die package 100.

The multi-stack die package 100 is illustrated as including a first level and a second level. It should be appreciated that the multi-stack die package 100 may include more or fewer levels. For example, instead of forming the bumps 134 and conductive connectors 136, a third level including dies, an encapsulant, and a redistribution structure may be formed on the second redistribution structure 132. Some, all, or none of the levels may include passive devices 118.

Although the passive device 118 may be connected to the first redistribution structure 114 with solder connectors, other connections with the first redistribution structure 114 and/or the second redistribution structure 132 in the multi-stack die package 100 may not be solder connections. As such, the multi-stack die package 100 may be substantially free of solder in regions other than the connections of the passive device 118 to the first redistribution structure 114.

Figure 10:
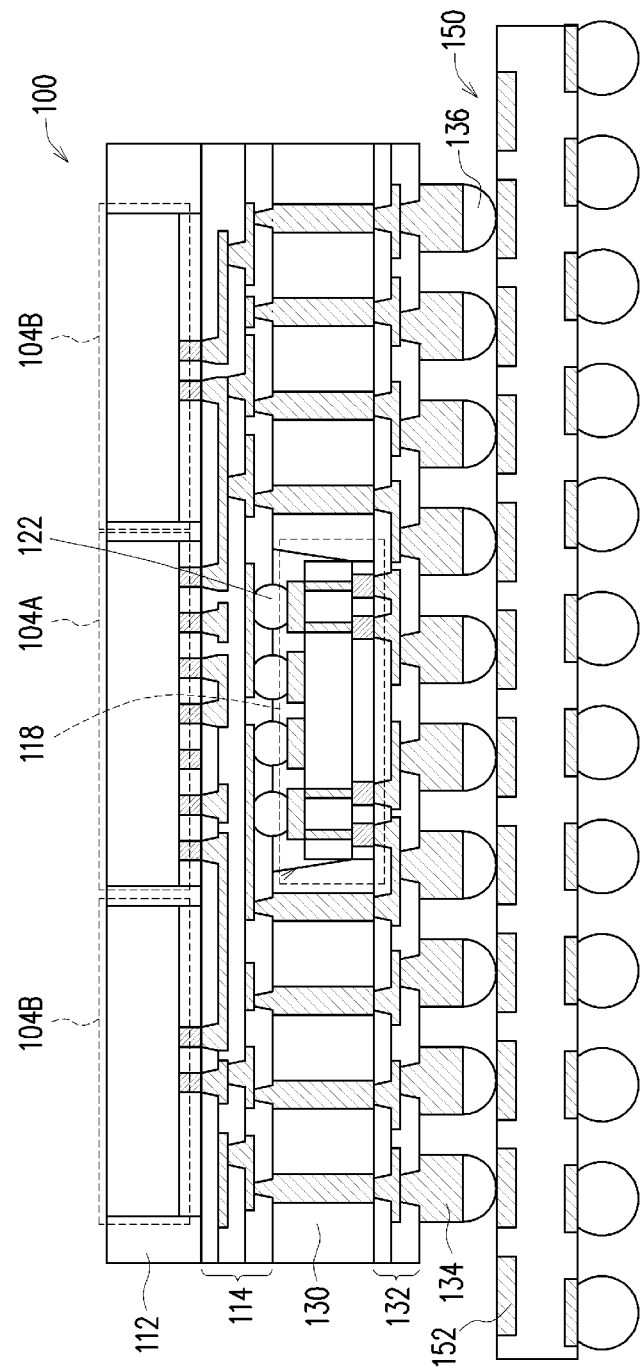

In FIG. 10, the multi-stack die package 100 is attached to a package substrate 150 to form a resulting package structure. The substrate 150 may be referred to as a package substrate 150, and may be, e.g., a printed circuit board (PCB) or the like, and may be connected to the multi-stack die package 100 using the conductive connectors 136. The package substrate 150 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the package substrate 150 may be a SOI substrate. Generally, an SOI substrate includes a layer of a semiconductor material such as epitaxial silicon, germanium, silicon germanium, SOI, SGOI, or combinations thereof. The package substrate 150 is, in one alternative embodiment, based on an insulating core such as a fiberglass reinforced resin core. One example core material is fiberglass resin such as FR4. Alternatives for the core material include bismaleimide-triazine BT resin, or alternatively, other PCB materials or films. Build up films such as ABF or other laminates may be used for package substrate 150.

The package substrate 150 may include active and passive devices (not shown). As one of ordinary skill in the art will recognize, a wide variety of devices such as transistors, capacitors, resistors, combinations of these, and the like may be used to generate the structural and functional requirements of the design for the resulting package structure. The devices may be formed using any suitable methods.

The package substrate 150 may also include metallization layers and vias (not shown), and bond pads 152 over the metallization layers and vias. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the package substrate 150 is substantially free of active and passive devices.

In some embodiments, the conductive connectors 136 are reflowed to attach the bumps 134 of the multi-stack die package 100 to the bond pads 152 of the package substrate 150. The conductive connectors 136 electrically and/or physically connect the substrate 150, including metallization layers in the substrate 150, to the multi-stack die package 100.

FIGS. 11 through 17 illustrate cross-sectional views of intermediate stages in the formation of a multi-stack die package, according to another embodiment. A first package region 200 for the formation of a first package is illustrated. It should be appreciated that multiple packages could be simultaneously formed in multiple package regions. Some details of the process flow shown in FIGS. 11 through 17 are similar to the details of the process flow shown in FIGS. 1 through 10. As such, some details will not be repeated herein.

Figure 11:
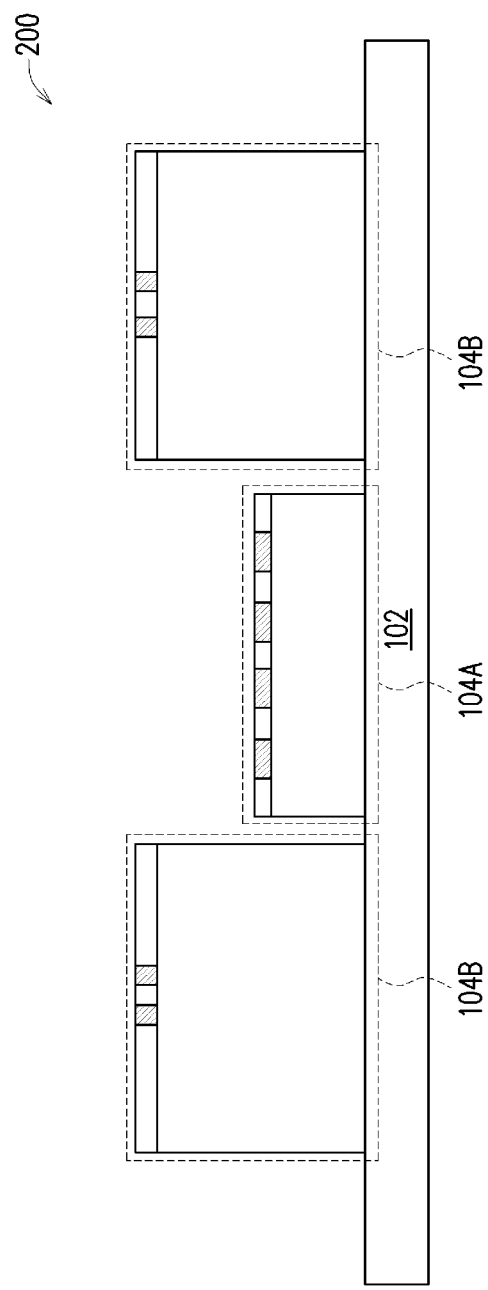
FIGS. 11 through 17 illustrate cross-sectional views of intermediate stages in the formation of a multi-stack die package, according to an embodiment.

In FIG. 11, the integrated circuit dies 104 are attached to the carrier substrate 102. The HBM dies 104B shown in the embodiment of FIGS. 11 through 17 may be higher capacity memories than the HBM dies 104B shown in the embodiment of FIGS. 1 through 10. As such, the HBM dies 104B may be thicker than the SoC die 104A.

Figure 12:
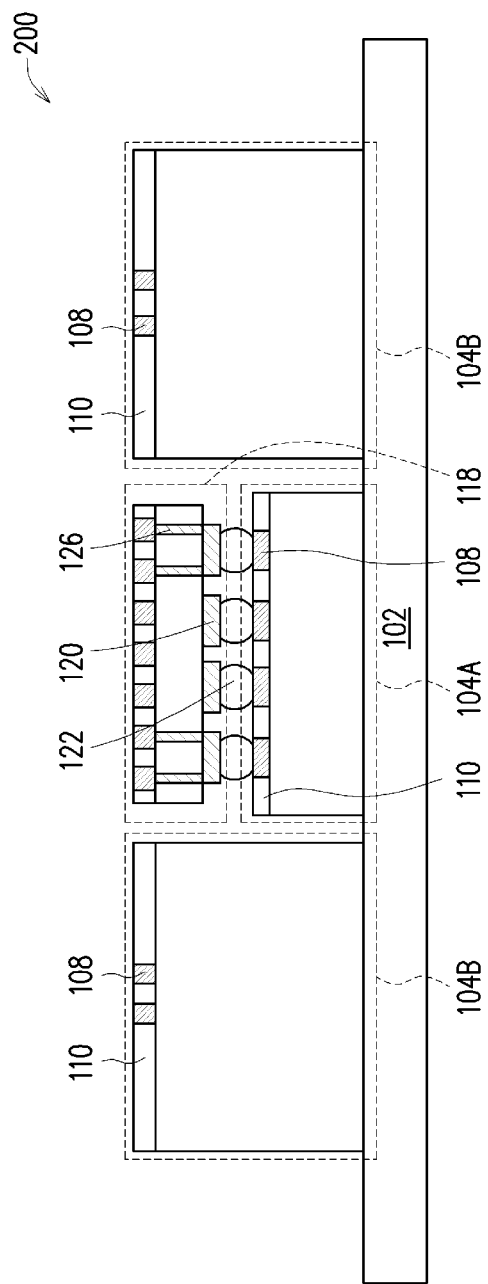

In FIG. 12, the passive device 118 is attached to the SoC die 104A. The passive device 118 is disposed over the SoC die 104A and between the HBM dies 104B. The conductive connectors 122 may be used to connect the bumps 120 of the passive device 118 directly to the die connectors 108 of the SoC die 104A. As such, the conductive connectors 122 may physically contact the bumps 120 and the die connectors 108.

Figure 13:
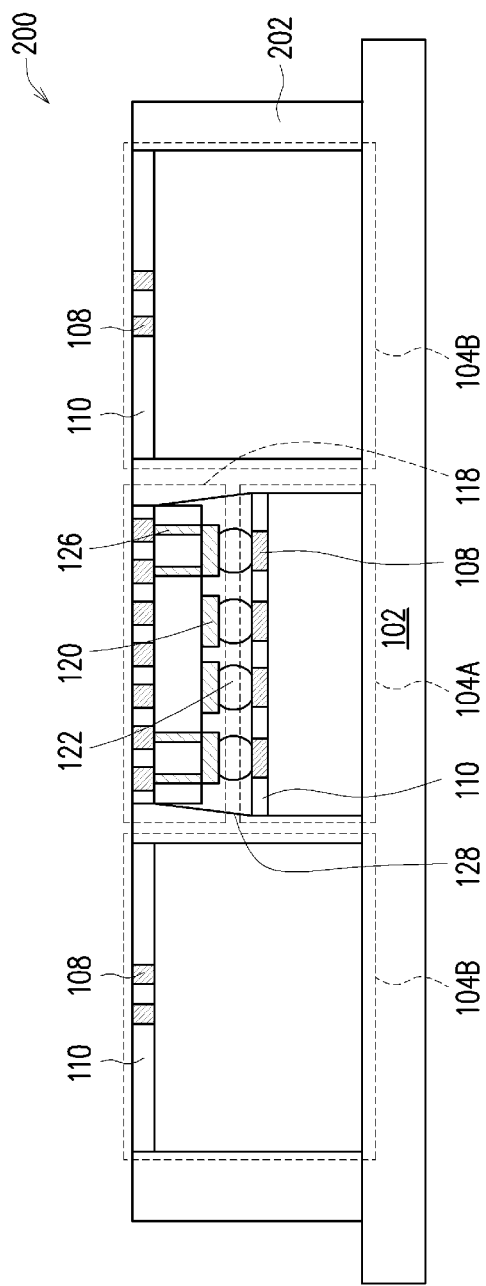

In FIG. 13, the underfill 128 is filled into the gap between the passive device 118 and the SoC die 104A. In the embodiment shown in FIGS. 11 through 17, the underfill 128 is used to adhere the passive device 118 to the SoC die 104A. An encapsulant 202 is formed on the integrated circuit dies 104 and the passive device 118. The encapsulant 202 may be similar to the encapsulant 130. After curing, the encapsulant 202 may undergo a planarization process to expose the die connectors 108 of the HBM dies 104B and the connectors 124 of the passive device 118. The planarization process may be a CMP, a grinding process, or the like. After planarization, top surfaces of the encapsulant 202, the integrated circuit dies 104 (e.g., the die connectors 108), and the passive device 118 (e.g., the connectors 124) are level.

Figure 14:
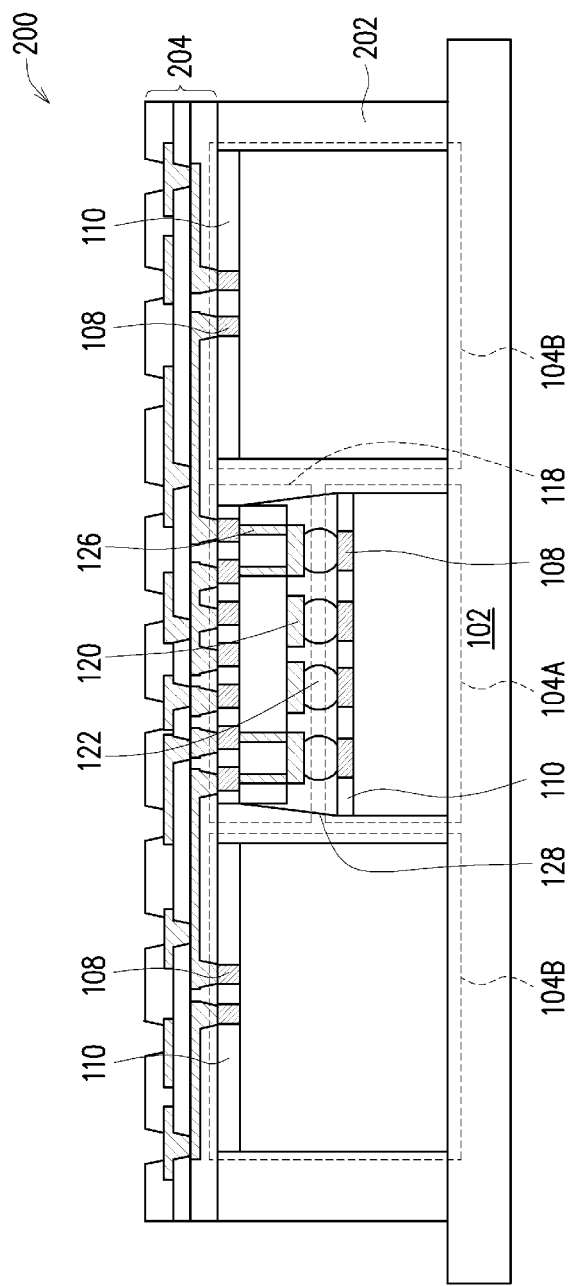

In FIG. 14, a redistribution structure 204 is formed over the integrated circuit dies 104 and the passive device 118. The redistribution structure 204 may be formed in a similar manner to the first redistribution structure 114. The redistribution structure 204 may be used to fan out electrical connections from the integrated circuit dies 104 and/or the passive device 118. The redistribution structure 204 is connected to the die connectors of the HBM dies 104B and the passive device 118, and is indirectly connected to the SoC die 104A through the TSVs 126 of the passive device 118. Notably, the redistribution structure 204 is not directly connected to the die connectors of the SoC die 104A. Openings may be formed in the top dielectric or passivation layer of the redistribution structure 204, exposing some or all of the top metal layer of the redistribution structure 204.

Figure 15:
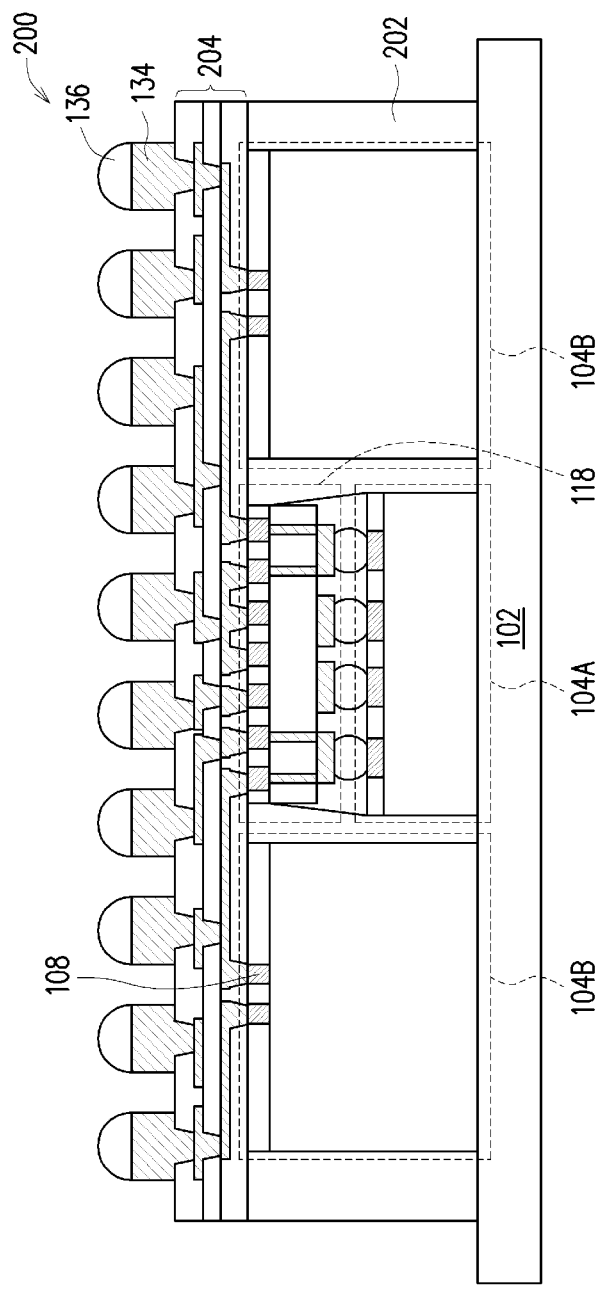

In FIG. 15, the bumps 134 are formed through the openings in the dielectric layers of the redistribution structure 204. The conductive connectors 136 are formed on the bumps 134.

Figure 16:
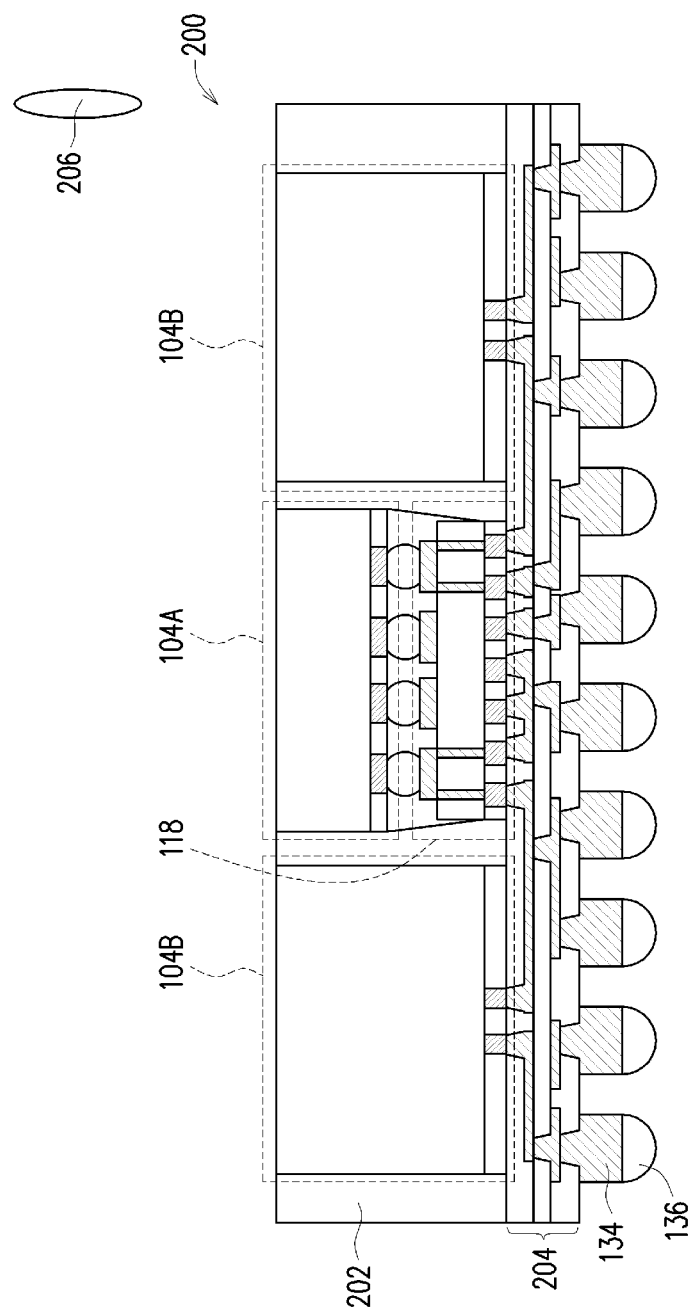

In FIG. 16, a carrier substrate de-bonding is performed to detach (de-bond) the carrier substrate 102 from the back side of the multi-stack die package. De-bonding may be accomplished through, e.g., use of a release layer (not shown), as discussed above. A singulation process is performed by sawing 206 along scribe line regions e.g., between the first package region 200 and adjacent regions. The resulting intermediate singulated multi-stack die package is from the first package region 200. The singulated packages may also be referred to as a multi-stack die package 200.

Figure 17:
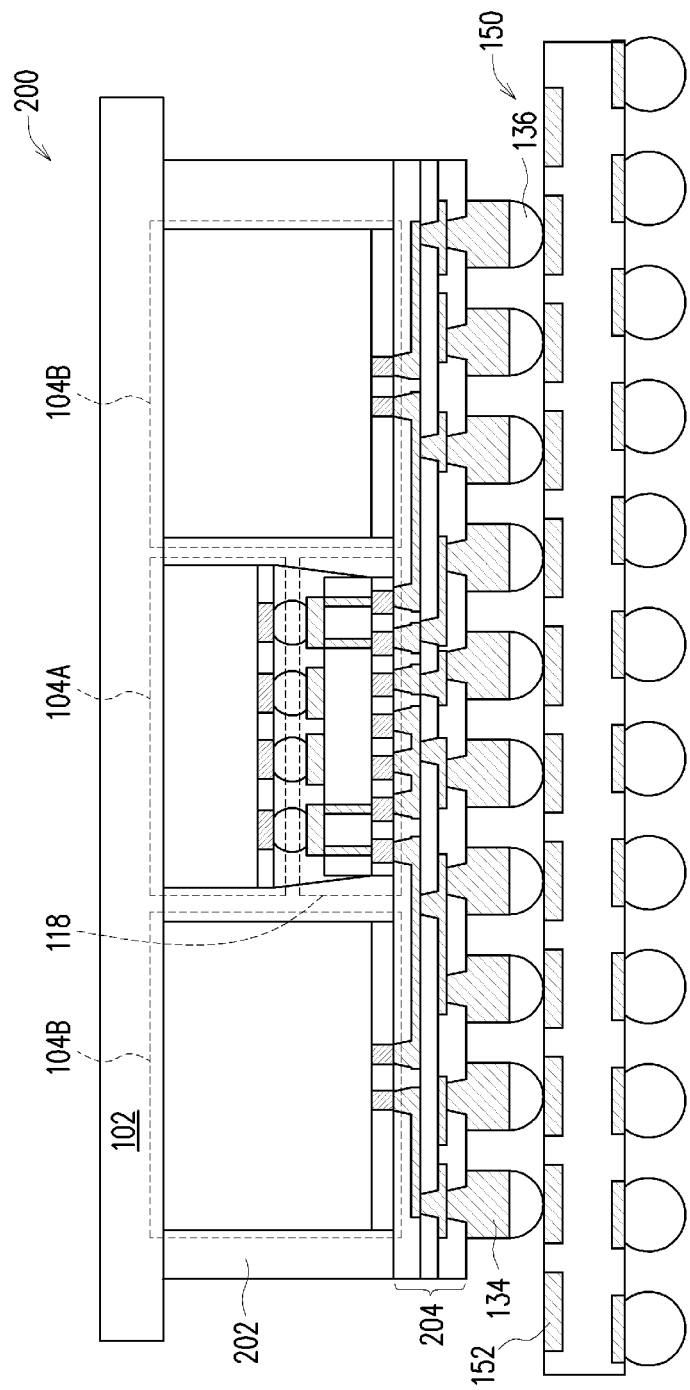

In FIG. 17, the multi-stack die package 200 is attached to the package substrate 150 to form a resulting package structure. The conductive connectors 136 are reflowed to attach the bumps 134 of the multi-stack die package 200 to the bond pads 152 of the package substrate 150.

Although the passive device 118 may be connected to the SoC die 104A with solder connectors, the connections with the redistribution structure 204 in the multi-stack die package 200 may not be solder connections. As such, the multi-stack die package 200 may be substantially free of solder in regions other than the connections of the passive device 118 to the SoC die 104A.

Embodiments may achieve advantages. By forming multi-stack packages, the solder regions that are used in conventional Package-on-Package (PoP) structures are either eliminated or at least reduced in number. Accordingly, the thickness of the resulting package is reduced. The repeated planarization of the dies and molding compound in the multi-stack packages may also reduce the package thickness. Integrating the passive devices with the multi-stack die package may reduce the amount of passive surface mount devices that are needed, further decreasing the thickness of the resulting package. Further, avoiding the use of passive surface mount devices may avoid comprising the I/O connector count of the resulting package.

In an embodiment, a device includes: a first die; a second die having a different function than the first die; a passive device over the second die; a first encapsulant around the passive device; and a first redistribution structure over the passive device, the first die, and the second die, the passive device electrically connecting the second die to a redistribution line of the first redistribution structure.

In some embodiments, the device further includes: a second redistribution structure over the first die and the second die, the passive device being interposed between the second redistribution structure. In some embodiments of the device, the passive device is physically and electrically connected to the second redistribution structure with solder connections. In some embodiments, the device further includes: a second encapsulant around the first die and the second die, the second redistribution structure physically separating the first encapsulant from the second encapsulant. In some embodiments, the device further includes: a plurality of conductive vias extending through the second encapsulant, the conductive vias electrically connecting the second redistribution structure to the first redistribution structure. In some embodiments of the device, top surfaces of the first encapsulant, the conductive vias, and the passive device are planar. In some embodiments of the device, top surfaces of the second encapsulant, the first die, and the second die are planar. In some embodiments of the device, the passive device is physically and electrically connected to the second die with solder connections. In some embodiments of the device, the first redistribution structure is further disposed over the first die and the second die. In some embodiments of the device, the first encapsulant further surrounds the first die and the second die. In some embodiments of the device, top surfaces of the first encapsulant, the first die, and the passive device are planar.

In an embodiment, a device includes: a first die; a second die having a different function than the first die; a first encapsulant surrounding the first die and the second die; a first redistribution structure over the first encapsulant, the first redistribution structure being electrically connected to the second die and the first die; a plurality of conductive vias in electrical connection with the first redistribution structure; a passive device attached to the first redistribution structure with conductive connections, the passive device being adjacent the conductive vias; and a second redistribution structure over the passive device, the second redistribution structure being electrically connected to the conductive vias and the passive device.

In some embodiments of the device, the passive device includes: a substrate, the substrate being free of active device regions; and a plurality of through silicon vias (TSVs) extending through the substrate, the TSVs being electrically connected to the conductive connections and the second redistribution structure. In some embodiments, the device further includes: a second encapsulant surrounding the conductive vias and the passive device, top surfaces of the second encapsulant, the conductive vias, and the passive device being planar. In some embodiments of the device, the second encapsulant is disposed between the passive device and the first redistribution structure, the second encapsulant surrounding the conductive connections. In some embodiments, the device further includes: an underfill disposed between the passive device and the first redistribution structure, the underfill surrounding the conductive connections, the underfill being different from the second encapsulant.

In an embodiment, a device includes: a first die; a second die having a different function than the first die; a passive device attached to the second die with conductive connections; an encapsulant surrounding the passive device, the first die, and the second die; and a redistribution structure over the encapsulant, the passive device, the first die, and the second die, the passive device electrically connecting the second die to a redistribution line of the redistribution structure.

In some embodiments of the device, the passive device includes: a substrate, the substrate being free of active device regions; and a plurality of through silicon vias (TSVs) extending through the substrate, the TSVs being electrically connected to the conductive connections and the redistribution structure. In some embodiments of the device, the encapsulant is disposed between the passive device and the second die, the encapsulant surrounding the conductive connections. In some embodiments, the device further includes: an underfill disposed between the passive device and the second die, the underfill surrounding the conductive connections, the underfill being different from the encapsulant.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A device comprising:
a first die;
a second die having a different function than the first die;
a passive device over the second die;
a first encapsulant around the passive device; and
a first redistribution structure over the passive device, the first die, and the second die, the passive device electrically connecting the second die to a redistribution line of the first redistribution structure.

2. The device of claim 1 further comprising:
a second redistribution structure over the first die and the second die, the passive device being interposed between the second redistribution structure.

3. The device of claim 2, wherein the passive device is physically and electrically connected to the second redistribution structure with solder connections.

4. The device of claim 2 further comprising:
a second encapsulant around the first die and the second die, the second redistribution structure physically separating the first encapsulant from the second encapsulant.

5. The device of claim 4 further comprising:
a plurality of conductive vias extending through the second encapsulant, the conductive vias electrically connecting the second redistribution structure to the first redistribution structure.

6. The device of claim 5, wherein top surfaces of the first encapsulant, the conductive vias, and the passive device are planar.

7. The device of claim 4, wherein top surfaces of the second encapsulant, the first die, and the second die are planar.

8. The device of claim 1, wherein the passive device is physically and electrically connected to the second die with solder connections.

9. The device of claim 8, wherein the first redistribution structure is further disposed over the first die and the second die.

10. The device of claim 8, wherein the first encapsulant further surrounds the first die and the second die.

11. The device of claim 10, wherein top surfaces of the first encapsulant, the first die, and the passive device are planar.

12. A device comprising:
a first die;
a second die having a different function than the first die;
a first encapsulant surrounding the first die and the second die;
a first redistribution structure over the first encapsulant, the first redistribution structure being electrically connected to the second die and the first die;
a plurality of conductive vias in electrical connection with the first redistribution structure;
a passive device attached to the first redistribution structure with conductive connections, the passive device being adjacent the conductive vias; and
a second redistribution structure over the passive device, the second redistribution structure being electrically connected to the conductive vias and the passive device.

13. The device of claim 12, wherein the passive device comprises:
a substrate, the substrate being free of active device regions; and
a plurality of through silicon vias (TSVs) extending through the substrate, the TSVs being electrically connected to the conductive connections and the second redistribution structure.

14. The device of claim 12 further comprising:
a second encapsulant surrounding the conductive vias and the passive device, top surfaces of the second encapsulant, the conductive vias, and the passive device being planar.

15. The device of claim 14, wherein the second encapsulant is disposed between the passive device and the first redistribution structure, the second encapsulant surrounding the conductive connections.

16. The device of claim 14 further comprising:
an underfill disposed between the passive device and the first redistribution structure, the underfill surrounding the conductive connections, the underfill being different from the second encapsulant.

17. A device comprising:
a first die;
a second die having a different function than the first die;
a passive device attached to the second die with conductive connections;
an encapsulant surrounding the passive device, the first die, and the second die; and
a redistribution structure over the encapsulant, the passive device, the first die, and the second die, the passive device electrically connecting the second die to a redistribution line of the redistribution structure.

18. The device of claim 17, wherein the passive device comprises:
a substrate, the substrate being free of active device regions; and
a plurality of through silicon vias (TSVs) extending through the substrate, the TSVs being electrically connected to the conductive connections and the redistribution structure.

19. The device of claim 17, wherein the encapsulant is disposed between the passive device and the second die, the encapsulant surrounding the conductive connections.

20. The device of claim 17 further comprising:
an underfill disposed between the passive device and the second die, the underfill surrounding the conductive connections, the underfill being different from the encapsulant.

* * * * *